United States Patent

Sun

(10) Patent No.: US 11,680,977 B2
(45) Date of Patent: Jun. 20, 2023

(54) TRANSIENT BASED FAULT LOCATION METHOD FOR UNGROUNDED POWER DISTRIBUTION SYSTEMS

(71) Applicant: Mitsubishi Electric Research Laboratories, Inc., Cambridge, MA (US)

(72) Inventor: Hongbo Sun, Lexington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 579 days.

(21) Appl. No.: 16/822,261

(22) Filed: Mar. 18, 2020

(65) Prior Publication Data

US 2021/0293873 A1    Sep. 23, 2021

(51) Int. Cl.
| | |
|---|---|
| *G01R 31/08* | (2020.01) |
| *G01R 31/52* | (2020.01) |
| *G06N 3/08* | (2023.01) |
| *G06N 3/084* | (2023.01) |

(52) U.S. Cl.
CPC ......... *G01R 31/088* (2013.01); *G01R 31/085* (2013.01); *G01R 31/086* (2013.01); *G01R 31/52* (2020.01); *G06N 3/084* (2013.01); *Y04S 10/52* (2013.01)

(58) Field of Classification Search
CPC .. G01R 31/088; G01R 31/085; G01R 31/086; G01R 31/52; G06N 3/0481; G06N 3/084; Y04S 10/52
See application file for complete search history.

(56) References Cited

U.S. PATENT DOCUMENTS

| | | | | |
|---|---|---|---|---|
| 2003/0067277 | A1* | 4/2003 | Parlos | H02P 29/02 318/400.21 |
| 2007/0078611 | A1* | 4/2007 | Huang | G01H 1/06 702/56 |
| 2011/0031977 | A1* | 2/2011 | O'Sullivan | G01R 31/088 706/15 |
| 2016/0041216 | A1* | 2/2016 | Tang | G01R 29/18 324/509 |
| 2020/0293032 | A1* | 9/2020 | Wang | G06N 3/0445 |

\* cited by examiner

*Primary Examiner* — Feba Pothen
*Assistant Examiner* — Joseph O Nyamogo
(74) *Attorney, Agent, or Firm* — Gennadiy Vinokur; Hironori Tsukamoto

(57) ABSTRACT

Systems and methods for identifying a fault condition in an Ungrounded Electrical Distribution (UED) system, the system receives measurements with instantaneous values and effective values associated when a fault event is identified, measured transient waveforms and a fault type. A processor applies an empirical mode decomposition to the measured transient waveforms to extract a dominant vibration mode and an associated derived waveform corresponding to the dominant vibration mode. A Hilbert transform is applied to the associated derived waveform to obtain a set of feature attributes. Subsets are computed from the set, at a pre-fault time, at a fault inception time, and at a post-fault time, and inputted into the fault type trained neural network model. An output of the model are locational parameters used to determine a fault section, a fault line segment and a fault location point with a topology connectivity analysis of the UED system.

18 Claims, 9 Drawing Sheets

TRANSIENT BASED FAULT LOCATION METHOD FOR UNGROUNDED POWER DISTRIBUTION SYSTEMS

FIELD

The present disclosure relates generally to electric power systems, and more particularly to transient based fault location method for ungrounded power distribution systems.

BACKGROUND

As energy consumers keep on increasing their demands, where electric utilities are not upgrading their existing equipment to keep up with the increasing demands of the energy consumers, resulting in the electric utilities being forced to make the most of their existing power systems. One of the main goals expected by today's energy consumers is for electric power systems to provide continuous supplies of energy, that have higher reliability and little to no power outages. Some conventional solutions the electric utilities have been using, is to decrease the frequency and duration of faults in an electric power systems or, more realistically, trying to detect and locate faults quickly in order to solve the fault problems quickly to meet energy consumers demands. The reason the electric power companies need to address faults problems quickly is to reduce customer power outages times and customer economic losses, which in turn can also reduce the electric power companies' maintenance and operation costs, i.e. financial losses due to not solving the fault problems. Thus, providing today's energy consumers with reliable continuous supply of energy is one of the most important problems for electrical power systems to overcome.

Some conventional methods for detecting and locating faults in electrical power systems can be classified into two categories, first is based on steady-state measurements, such as impedance-based methods, and the second is based on transient state measurements, such as travelling wave-based methods. The traveling wave-based technique used for transient-based fault location methods is one of the most common. US 2004/0189317A1 which is now U.S. Pat. No. 6,822,457 B2, discloses a conventional traveling wave-based fault location method that determines velocity of propagation and the location of a fault on an electric transmission line. The 317' uses a system that includes high frequency transmitter and receiver combinations to monitor and detect high frequency bursts produced by the transmitters and by faults. However, these traveling wave fault locator methods including the 317' methods are directed for AC power transmission lines, such that these methods and techniques are not suited and are very difficult to implement for power distribution systems. At least one reason, among many reasons, is due to a very short/small propagation time and a low latency between incident waves and associated reflected waves which is nearly impossible to individually detect in short line or cable lengths. Thus, such traveling wave fault locator methods and techniques not suited for solving todays transient based fault location for ungrounded power distribution system problems, and cannot provide for more accurate transient based technologies for fault location estimation of power distribution systems.

Accordingly, there is need for more accurate transient based technologies for fault location estimation of power distribution systems.

SUMMARY

The present disclosure relates to electric power systems, and more particularly to transient based fault location method for ungrounded power distribution systems.

Some embodiments of the present disclosure include transient based fault location methods for ungrounded distribution systems. This disclosure aims to provide fast detection and localization technology for short circuit faults in three-phase ungrounded distribution systems. The most common type of short circuit in a three-phase system is a single phase to ground fault. This is when one of the phase wires in a circuit comes into contact with a ground. The next most common type of short circuit is a phase to phase or wire to wire fault—when two of the phase wires in a circuit come into contact with each other. Next is a double phase or double wire to ground fault—two of the three phase wires in a circuit simultaneously come into contact with a ground. And lastly, the least common type of short circuit is a three phase or three wire fault—when all three wires come into contact with each other or a ground. Ungrounded systems operate without a grounded wire. In other words, none of the phase wires of the electrical system are intentionally grounded to a ground. Therefore, a single sustained phase-to-ground fault does not result in an automatic trip of the overcurrent protection device. This is a major benefit if electrical system continuity is required or if it would result in the shutdown of a continuous process. However, if an accidental ground fault occurs and is allowed to flow for a substantial time, over-voltages can develop in the associated phase wires. Such an overvoltage situation can lead to conductor insulation damage, and while a ground fault remains on one phase of an ungrounded system, personnel contacting one of the other phases and ground are subjected to 1.732 times the voltage they would experience on a solidly neutral grounded system. Up-to-now, conventional fault detection approaches have faced serious challenges for locating the short circuit faults for ungrounded systems, particularly for single-phase-to-ground faults.

Considered that a power distribution system is formed as a network of phase wires which can be modeled as series impedances and shunt admittances, i.e. RLC circuits, at least one realization is realizing an evolving process of a short circuit fault in the system that can be regarded as a mixture of multiple RLC circuit oscillations triggered by a fault event. A RLC circuit is an electrical circuit including components of a resistor (R), an inductor (L), and a capacitor (C), connected in series or in parallel. The RLC circuit forms a harmonic oscillator for current, and resonates in a similar way as an resonant circuit, i.e. includes an inductor and capacitor. Therefore, the measured transient responses to the fault event can be directly used to identify fault condition, and track fault evolution process.

Another realization is that fault evolution process can be mainly described or represented by a dominant vibration mode, which can be extracted from voltage/current transient response waveforms collected from measuring points, when the fault occurs by applying an empirical mode decomposition (EMD) or an ensemble empirical mode decomposition (EEMD) to the collected waveforms. In view of the developments of distribution automations, intelligent switches are gradually replacing conventional switches. Therefore, the measurements are collected from the intelligent switches. Intelligent switches are also called Intelligent Electronic Devices (IEDs). An IED can receive data from sensors and power equipment and can issue control commands, such as tripping circuit breakers if they sense voltage, current, or frequency anomalies, or raise/lower voltage levels in order to maintain the desired level. Common types of IEDs include protective relaying devices, On Load Tap Changer controllers, circuit breaker controllers, capacitor bank switches, recloser controllers, voltage regulators etc. Digital protective relays are primarily IEDs, using a microprocessor to perform several protective, control and similar functions. A typical IED can contain around 5-12 protection functions, 5-8 control functions controlling separate devices, an autoreclose function, self monitoring function, communication functions etc.

The voltage/current transient response waveforms collected from intelligent switches from ungrounded power distribution systems is data that is nonstationary data, which is data that changes over time. The data is collected for a period of time before the fault event occurs, during the fault event and after the fault event has occurred. In other words, upon collecting waveform data, the data is then applied to the EMD method to begin statistical analysis of the fault event by obtaining many vibration modes, and from the vibration modes determines a dominant vibration mode. The determined vibration mode is then used to examine fault evolution process for the fault event, among other aspects.

For example, the EMD method is a fundamental part of the Hilbert-Huang transform (HHT) method. The HHT method is particularly useful as a way to decompose a signal, i.e. signals collected from measuring points, into so-called intrinsic mode functions (IMF) along with a trend, and obtain instantaneous frequency data. The HHT and EMD methods are designed to work well for data that is nonstationary and nonlinear, like the collected waveform data collected from the intelligent switches. To better understand what is nonstationary data or a non-stationary series data, the data has statistical properties that change over time. Like the collected waveform data that changes over time that begins collecting data for a sequence of time via the measuring points, i.e. the data for the sequence is data collected before, during and after the fault event. This sequence of time for collecting the waveform data through the fault event can be considered a non-stationary series.

In order to use the non-stationary series or the collected waveform data, the non-stationary series needs to be converted to stationary data, (for example by trend removal), so that further statistical analysis can be done on the de-trended stationary data. This is so because for example, if the series is consistently increasing over time, the sample mean and variance will grow with the size of the sample, and they will always underestimate the mean and variance in future periods. The usual mean of "de-trending" a series is to fit a regression line or curve and then subtract it from the original data. In fact, most statistical forecasting methods assume that the time series are approximately stationary. A stationary is predictable, where you forecast that its statistical properties will be the same in the future, as they have been in the past. For example, the EMD method breaks down the signals, i.e. the non-stationary series or the collected wave form data, into various components. Where, a complicated data set is decomposed into a finite and often small number of components. These components form a complete and nearly orthogonal basis for the original signal. Of which, they can also be described as intrinsic mode functions (IMF), as noted above. Because the first IMF usually carries the most oscillating (high-frequency) components, the first IMF can be rejected to remove high-frequency components (e.g., random noise). Wherein, without leaving the time domain, the EMD method can be adaptive and very computationally efficient. Since the decomposition is based on the local characteristic time scale of the data, the EMD method can be applied to nonlinear and nonstationary processes, such as to the collected wave form data.

Based upon converting the collected wave form data from the non-stationary series or the collected waveform, then further statistical analysis can be done on the de-trended stationary data for obtaining a dominant vibration mode, which will be used to describe the fault evolution process of the fault event. In order to obtain the dominate vibration mode, many vibration modes are obtained, and from the many vibration modes a dominate vibration mode can be determined.

After extracting a dominate vibration mode to represent the fault evolution process, a limited number of instantaneous and integral feature attributes are then capable of being determined based on applying the Hilbert-Huang transform to the derived waveform corresponding to the dominant vibration mode. Wherein the limited number of instantaneous and integral feature attributes can include instantaneous frequency, instantaneous phase, and instantaneous amplitude, integral of amplitude, integral of amplitude square, and integral of amplitude-frequency product square. The instantaneous feature attributes represent the impacts of fault inception time and fault severity, and the integral feature attributes assists modeling pre-fault and post-fault conditions.

For an oncoming fault event, the fault inception time can be determined based on peaks of instantaneous amplitudes and turning points of instantaneous phases of extracted dominant vibration mode.

After that, the realized set of instantaneous and integral feature attributes at specified as pre-fault time, fault inception time, and specified post-fault fault time, are used to characterize the fault evolving process. Different fault location point, fault inception time, fault type, fault impedance and pre-fault conditions will result in different realization of instantaneous and integral feature attributes, due to different fault and system conditions within the unground distribution system. A half cycle of power frequency before a fault inception, and a half cycle of power frequency after the fault inception are specified as characteristic pre-fault time and post-fault time.

Therefore, the relationship between the fault locations with the realizations of instantaneous and integral feature attributes can be learned through developing a fault event databank over time and executing supervised learning of fault event samples. The fault events can be actual ones, or be generated through time domain simulation with a given fault condition and a given pre-fault system condition. Wherein the fault condition includes fault type, fault location point, fault impedance at the fault location point, and fault inception time. Wherein the system condition includes load demands, generation outputs, and voltage levels. Each fault event may have different fault location, fault inception time, fault type and pre-fault system condition. Once a new fault occurs, the new fault location can be determined based on a corresponding instantaneous and integral feature attributes of extracted dominant vibration mode from latest received measurement waveforms, and the previous determined relationship between the feature attributes and fault locations from the developed fault event databank.

Instead of directly using distances from reference points to locate the fault location, which might be less effective due to considerate number of overhead and cable types and laterals within the distribution systems, a set of three location relevant parameters is used to define the fault location point to the reference points. The set of locational parameters include an equivalent inductance, a square root of inductance and capacitance product, and a square root of resistance and inductance product determined for a shortest path between the fault point and the corresponding reference points. Wherein the reference points can include a location of a substation, a location of distributed generation resource, or a location of intelligent switch.

In this disclosure, the instantaneous and integral feature attributes are used for describing the fault event and pre-fault condition and post-fault impacts. Wherein the candidate feature attributes or subsets of the feature attributes include the instantaneous amplitudes, instantaneous phase, instantaneous frequency, integral amplitudes, integral amplitude squares, and integral square of amplitude and frequency product at half cycle before the fault event, occurring time of the fault event, and half cycle after the fault event. Also, the candidate feature attributes can be prioritized based on a maximal correlation factor among the feature attribute under study and different locational parameters. Only the candidate feature attributes greater than a given predetermined threshold are chosen to be used for fault location estimation.

According to an embodiment of the disclosure, a system for identifying a fault condition in an Ungrounded Electrical Distribution (UED) system, the system having a memory with stored data including trained neural network models, a transceiver to receive measurements with instantaneous values and effective values associated when a fault event is identified, from intelligent switches installed in the UED system, via an information network in communication with the UED system, such that the intelligent switches determine measured voltage/current transient response waveforms and a fault type, the system comprising: a processor of a computer in communication with the information network, that is configured to apply an empirical mode decomposition to the voltage and current response waveform measurements to extract a dominant vibration mode and an associated derived waveform corresponding to the dominant vibration mode, and apply a Hilbert transform to the associated derived waveform to obtain a set of instantaneous and integral feature attributes; computing corresponding time relationships of subsets from the set of instantaneous and integral feature attributes, at a pre-fault time period to obtain a subset of pre-fault feature attributes, at a fault inception time period to obtain a subset of fault inception feature attributes, and at a post-fault time period to obtain a subset of fault inception feature attributes; input the subsets of the instantaneous and integral feature attributes into the stored trained neural network model associated with the identified fault type, such that the trained neural network model outputs locational parameters, such that some locational parameters describe a relationship between one or more intelligent switch locations and an estimated fault location; determine a fault section, a fault line segment and a fault location point using the locational parameters with a topology connectivity analysis of the UED system; deliver, via the transceiver, the determined fault location point associated with the fault condition in UED system to operators, to initiate actions associated with the determined fault location point via the information network.

According to an embodiment of the disclosure, a method for identifying a fault condition in an Ungrounded Electrical Distribution (UED) system, the method having a memory with stored data including trained neural network models, and retrieves measurements with instantaneous values and effective values associated when a fault event is identified, from intelligent switches installed in the UED system, via a network in communication with the UED system, such that the intelligent switches determine measured voltage/current transient response waveforms and a fault type, the method comprising: using a hardware processor of a computer in communication with the network, the hardware processor is configured for applying an empirical mode decomposition to the voltage and current response waveform measurements to extract a dominant vibration mode and an associated derived waveform corresponding to the dominant vibration mode; applying a Hilbert transform to the associated derived waveform to obtain a set of instantaneous and integral feature attributes; computing corresponding time relationships of subsets from the set of instantaneous and integral feature attributes, at a pre-fault time period to obtain a subset of pre-fault feature attributes, at a fault inception time period to obtain a subset of fault inception feature attributes, and at a post-fault time period to obtain a subset of fault inception feature attributes; inputting the subsets of the instantaneous and integral feature attributes into the stored trained neural network model associated with the identified fault type, such that the trained neural network model outputs locational parameters, such that some locational parameters describe a relationship between one or more intelligent switch locations and an estimated fault location; determining a fault section, a fault line segment and a fault location point using the locational parameters with a topology connectivity analysis of the UED system; delivering the determined fault location point associated with the fault condition in UED system to operators, to initiate actions associated with the determined fault location point via the network.

According to an embodiment of the disclosure, a non-transitory computer readable storage medium embodied thereon a program executable by a computer for performing a method. The method for identifying a fault condition in an Ungrounded Electrical Distribution (UED) system, the method having a memory with stored data including trained neural network models, and retrieves measurements with instantaneous values and effective values associated when a fault event is identified, from intelligent switches installed in the UED system, via a network in communication with the UED system, such that the intelligent switches determine measured voltage/current transient response waveforms and a fault type, the method comprising: using a processor of a computer in communication with the network, the processor is configured for applying an empirical mode decomposition to the voltage and current response waveform measurements to extract a dominant vibration mode and an associated derived waveform corresponding to the dominant vibration mode; applying a Hilbert transform to the associated derived waveform to obtain a set of instantaneous and integral feature attributes; computing corresponding time relationships of subsets from the set of instantaneous and integral feature attributes, at a pre-fault time period to obtain a subset of pre-fault feature attributes, at a fault inception time period to obtain a subset of fault inception feature attributes, and at a post-fault time period to obtain a subset of fault inception feature attributes; inputting the subsets of the instantaneous and integral feature attributes into the stored trained neural network model associated with the identified fault type, such that the trained neural network model outputs locational parameters, such that some locational parameters describe a relationship between one or more intelligent switch locations and an estimated fault location; determining a fault section, a fault line segment and a fault location point using the locational parameters with a topology connectivity analysis of the UED system; delivering the determined fault location point associated with the fault condition in UED system to operators, to initiate actions associated with the determined fault location point via the network.

BRIEF DESCRIPTION OF THE DRAWINGS

The present disclosure is further described in the detailed description which follows, in reference to the noted plurality of drawings by way of non-limiting examples of exemplary embodiments of the present disclosure, in which like reference numerals represent similar parts throughout the several views of the drawings. The drawings shown are not necessarily to scale, with emphasis instead generally being placed upon illustrating the principles of the presently disclosed embodiments.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The present disclosure relates to electric power systems, and more particularly to transient based fault location method for ungrounded power distribution systems.

Figure 1A:
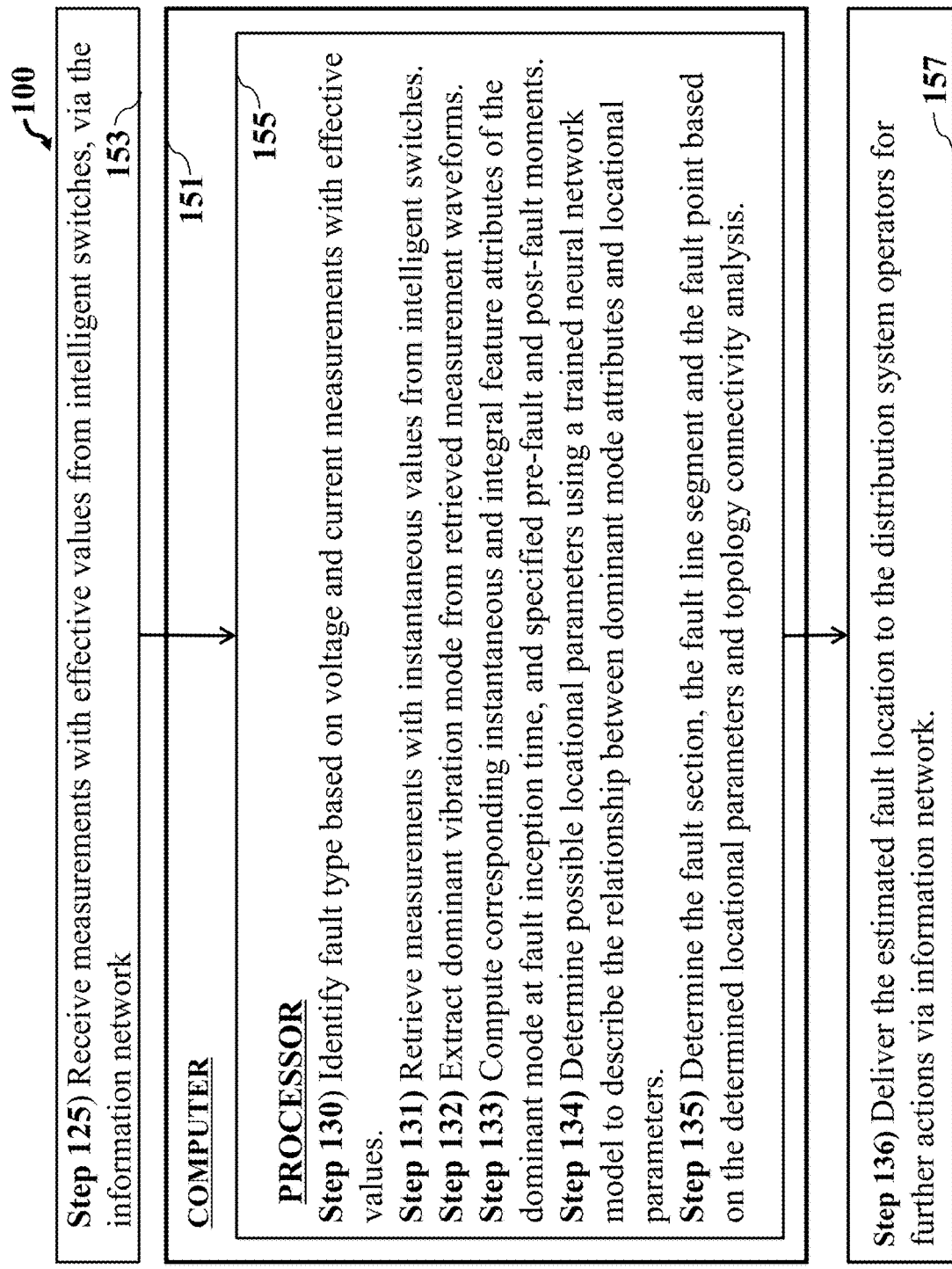
FIG. 1A is a block diagram illustrating a method for detecting and locating a fault in a power distribution system, according to embodiments of the present disclosure.

FIG. 1A is a block diagram illustrating a method for detecting and locating a fault of an ungrounded power distribution system, according to embodiments of the present disclosure.

Step 125 of FIG. 1A includes method 100 receiving measurements with effective values from intelligent switches, via the information network 153.

Step 130 of FIG. 1A includes method 100 using a hardware processor 155 of a computer 151 to identify fault type based on voltage and current measurements with effective values.

Step 131 of FIG. 1A includes method 100 using the hardware processor 155 to retrieve measurements with instantaneous vales from intelligent switches when a fault is identified in step 130.

Step 132 of FIG. 1A includes method 100 using the hardware processor 155 to extract dominant vibration mode from retrieved measurement waveforms, and Step 133 compute corresponding instantaneous and integral feature attributes of the dominant vibration mode at fault inception time, and specified pre-fault and post-fault moments.

Step 134 of FIG. 1A includes method 100 using the hardware processor 155 to determine possible locational parameters using a trained neural network model to describe the relationship between dominant mode feature attributes and locational parameters, and Step 135 determine the fault section, fault line segment and fault point based on the determined locational parameters and topology connectivity analysis.

Step 136 of FIG. 1A, using a communication device 157 to deliver the estimated fault location to the distribution system operators for further actions via information network 153.

Figure 1B:
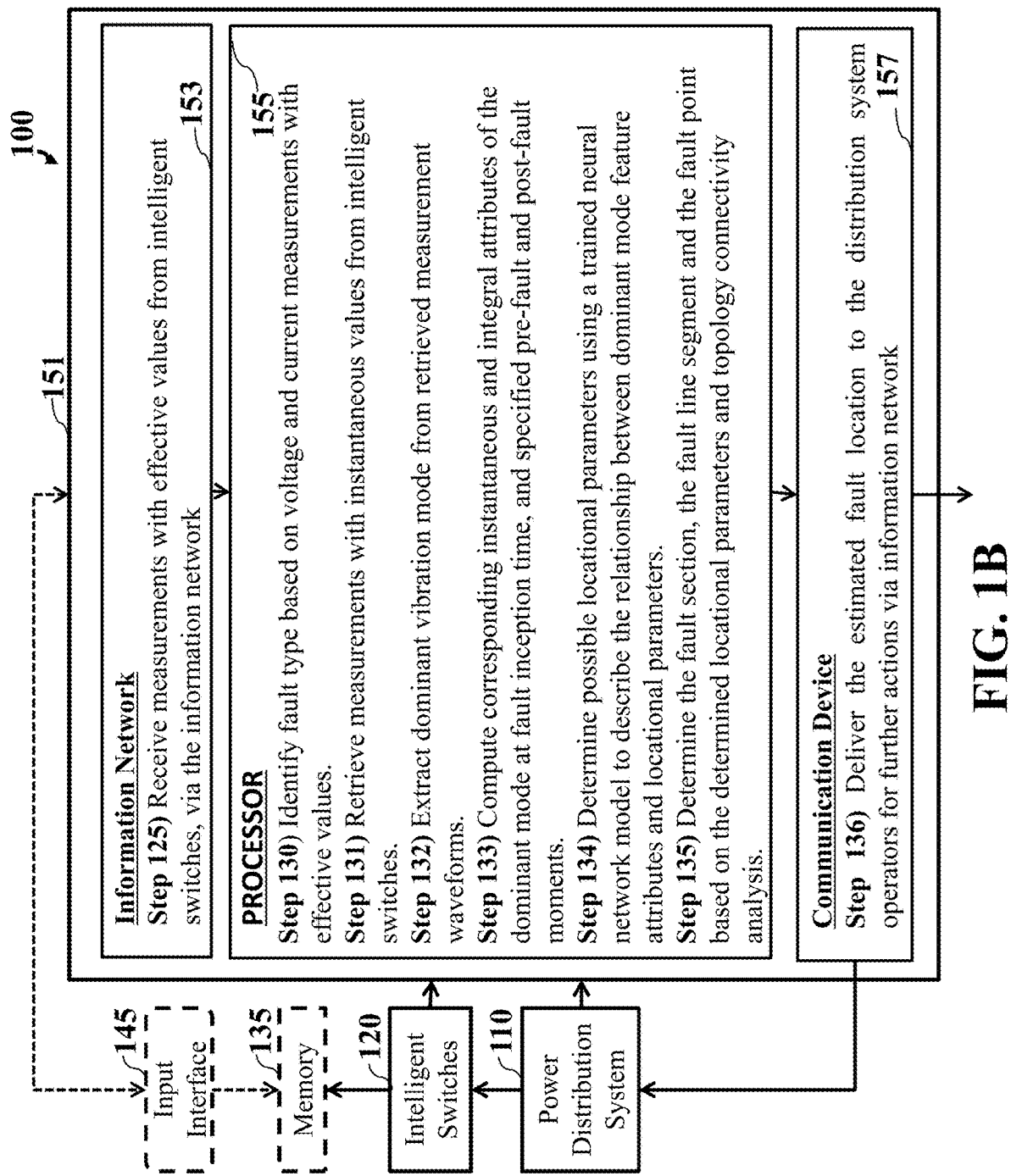
FIG. 1B is a block diagram illustrating the system of FIG. 1A, implemented using some components of the system, according to some embodiments of the present disclosure.

FIG. 1B is a block diagram illustrating the system of FIG. 1A, wherein the system is implemented using some components, according to some embodiments of the present disclosure. FIG. 1B can include a computer or a computer system 151, which consists of a hardware processor 155 in communication with an input interface 145, a memory 135, an information network 153, a communication device 157. The communication device 157 can be connected to the power distribution system 110 that equipped with intelligent switches 120. The computer 151 can send and receive information from and to power distribution systems. It is contemplated the hardware processor 155 can include two or more hardware processors depending upon the requires of the specific application. Certainly, other components may be incorporated with system 100 including input interfaces, output interfaces and transceivers.

Step 125 of FIG. 1B includes system 100 receiving measurements with effective values from intelligent switches via the information network 153.

Step 130 of FIG. 1B includes system 100 using a hardware processor 155 of a computer 151 to identify fault type based on voltage and current measurements with effective values.

Step 131 of FIG. 1B includes system 100 using the hardware processor 155 to retrieve measurements with instantaneous values from intelligent switches if a fault is identified in step 130.

Step 132 of FIG. 1B includes extracting dominant vibration mode from retrieved measurement waveforms, and step 133 includes computing corresponding instantaneous and integral feature attributes of the dominant mode at fault inception time, and specified pre-fault and post-fault moments.

Step 134 of FIG. 1B includes determining possible locational parameters using a trained neural network model to describe the relationship between dominant mode feature attributes and locational parameters, and step 135 determining the fault section, the fault line segment and the fault point based on the determined locational parameters and topology connectivity analysis.

Step 136 of FIG. 1B includes using a communication device 157 to deliver the estimated fault location to the distribution system operators for further actions via information network 153.

Ungrounded Power Distribution System with Intelligent Switches

Figure 2:
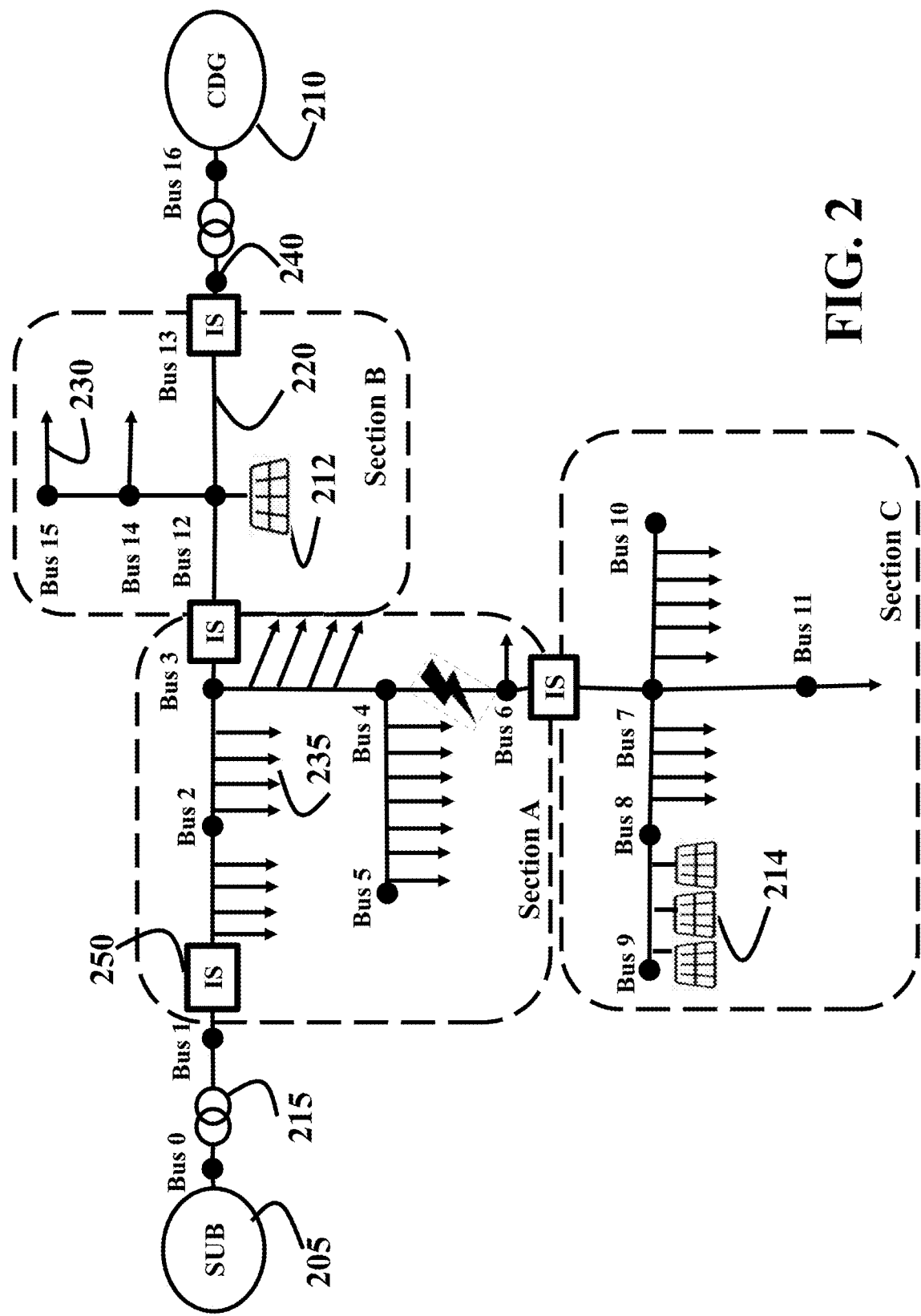
FIG. 2 is a schematic illustrating for a power distribution system with intelligent switches, according to some embodiments of the present disclosure.

FIG. 2 is a schematic illustrating the components for a power distribution system with intelligent switches, according to some embodiments of the present disclosure.

The power supply resources for a power distribution system 110 includes a substation 205 connected to a transmission system (not shown in the figure), and a set of distributed generators 210, 212 and 214 located within the system 110. A distributed generator can be a solar panel, a wind farm, a micro-turbine, or a battery. Those power resources provide power supply to the system through a transformer or voltage regulator 215 with ungrounded winding connections, and deliver the powers to the customers through distribution lines 220. The power consumptions of customers can be represented as a lumped load 230 located at a bus 240, or distributed load 235 along the distribution lines 220. The distributed generator can be controllable distributed generator (CDG) 210, or uncontrollable distributed generator 212 and 214. The controllable distributed generator has the capability to regulate the voltages at its terminal bus. The uncontrollable distributed generator can be installed at a bus 212, or installed along a line in a distributed manner 214. The uncontrollable distributed generator does not have the capability to regulate the voltages, and can be treated negative loads. An intelligent switch 250 can be installed at a terminal bus 240 on a distribution line 220 to energize or deenergizes the line segment. The intelligent switch 250 also provides measurements for voltages at its attached terminal bus 240 and currents flowing through its attached line segment 220. The power distribution system 110 is operated by a distribution system operator (DSO) (not shown in the figure). The intelligent switch can be a circuit breaker, recloser, or sectionalizer equipped with advanced measurement unit.

Still referring to FIG. 2, the intelligent switch provides two types of electrical measurements. The first type is of effective values, i.e. RMS (root mean square) values sampled at a slower rate, such as once a second. In this disclosure, the first type of measurements are used to evaluate system steady-state behaviors, and employed to determine whether there is a fault in the system and fault type in this disclosure. The second type is of instantaneous values sampled at a faster rate, such as 5000 times per second. In this disclosure, the second type of measurements are used to capture system transient responses to fault events, and employed to determine the actual fault section, the actual fault lines segment and the actual fault point along the faulted line segment.

For a three-phase ungrounded power distribution system, the measurements may include phase currents for each phase, and phase-to-ground voltages for each phase, or phase-to-phase voltages for each pair of phases among all three phases. The measurements may also include zero-sequence voltages and zero-sequence currents. If the voltages are provided by phase pairs, the phase to ground voltages can be derived using those measurements along with zero sequence voltages.

Still referring to FIG. 2, taken the voltages provided in term of effective values as examples, the phase to ground voltages can be determined as:

$$V_A = \frac{1}{3}(V_{AB} - V_{CA}) + V_0 \quad (1)$$

$$V_B = \frac{1}{3}(V_{BC} - V_{AB}) + V_0$$

$$V_C = \frac{1}{3}(V_{CA} - V_{BC}) + V_0$$

wherein $V_A$, $V_B$ and $V_C$ are RMS (root of mean square) values for the phase to ground voltages for phase A, phase B, and phase C, respectively. $V_{AB}$, $V_{BC}$ and $V_{CA}$ are RMS values for the voltages between phase A and phase B, phase B and phase C, and phase C and phase A, respectively. $V_0$ is RMS value for the zero-sequence voltage.

To simplify the computation of fault location analysis, the measured instantaneous voltage and currents on three phases are converted into alpha-beta-gamma components using power invariant transformation, according to:

$$\begin{bmatrix} v_\alpha(t) \\ v_\beta(t) \\ v_\gamma(t) \end{bmatrix} = \begin{bmatrix} \frac{\sqrt{2}}{\sqrt{3}} & -\frac{1}{\sqrt{6}} & -\frac{1}{\sqrt{6}} \\ 0 & \frac{1}{\sqrt{2}} & -\frac{1}{\sqrt{2}} \\ \frac{1}{\sqrt{3}} & \frac{1}{\sqrt{3}} & \frac{1}{\sqrt{3}} \end{bmatrix} \begin{bmatrix} v_a(t) \\ v_b(t) \\ v_c(t) \end{bmatrix} \quad (2a)$$

$$\begin{bmatrix} i_\alpha(t) \\ i_\beta(t) \\ i_\gamma(t) \end{bmatrix} = \begin{bmatrix} \frac{\sqrt{2}}{\sqrt{3}} & -\frac{1}{\sqrt{6}} & -\frac{1}{\sqrt{6}} \\ 0 & \frac{1}{\sqrt{2}} & -\frac{1}{\sqrt{2}} \\ \frac{1}{\sqrt{3}} & \frac{1}{\sqrt{3}} & \frac{1}{\sqrt{3}} \end{bmatrix} \begin{bmatrix} i_a(t) \\ i_b(t) \\ i_c(t) \end{bmatrix} \quad (2b)$$

wherein $v_a(t)$, $v_b(t)$ and $v_c(t)$ are instantaneous values for the phase to ground voltages at time t on phase A, phase B, and phase C, respectively. $v_\alpha(t)$, $v_\beta(t)$ and $v_\gamma(t)$ are alpha, beta and gamma components of instantaneous voltages at time t on phase A, phase B, and phase C, respectively. $i_a(t)$, $i_b(t)$ and $i_c(t)$ are instantaneous values for the phase to ground voltages/currents at time t on phase A, phase B, and phase C, respectively. $i_\alpha(t)$, $i_\beta(t)$ and $i_\gamma(t)$ are alpha, beta and gamma components of instantaneous currents at time t on phase A, phase B, and phase C, respectively. The alpha and beta components are called as aerial-mode components, and the gamma component is called ground-mode component. In this disclosure, the gamma component $v_\gamma(t)$ is used to locate the phase to ground faults, and alpha and beta components, $i_\alpha(t)$, $i_\beta(t)$ are used to locate other types of faults.

Determine Fault Type Based on Effective Measurements

Still referring to FIG. 2, in this disclosure, the fault type is first determined based on effective voltage and current measurements collected from the intelligent switches.

The possible fault types include single-phase-to-ground, phase-to-phase, double-phase-to-ground, three-phase-to-ground, and phase-to-phase-to-phase faults. For an ungrounded power distribution system as shown in FIG. 2, the fault type is determined based on the measured effective voltages and currents collected from the intelligent switch installed at the secondary side of substation transformer. We first check whether there is over-current existing on the intelligent switch at any phase. If there is no over-current existing, we further check whether there is over-voltage existing on the intelligent switch at any phase. If there are over-voltages, it is determined that the fault type is single-phase-to-ground fault. If neither over-currents nor over-voltages exist, there is no fault in the circuit downstream to the intelligent switch. If there is over-current existing, there is a double-phase or three-phase fault occurring in the circuit downstream to the intelligent switch. The type of fault is determined according to the number of phases with over-currents. If there are two phases having over-currents, the fault is either a double phase to ground one, or a phase-to-phase one, and the actual type is further determined by checking whether there is over-voltage on the phase without over-current. If there is over-voltage existing, the fault type is double-phase-to-ground fault. Otherwise, it is a phase-to-phase fault. If there are three phases having over-currents, then there is a three-phase-to-ground fault or phase-to-phase-to-phase fault downstream to the device.

A phase x is determined as having over-current, if the following condition is met:

$$|I_{p,x}|/I_{p,x}^{rated} \geq \bar{I} x \in \{a,b,c\} \tag{3}$$

wherein $|I_{p,x}|$ and $I_{p,x}^{rated}$ are the magnitude of measured effective current, and rated current on phase x at the switch p, $\bar{I}$ is the pre-defined threshold of current ratio of measured current over rated current used for over current status determination. For example, $\bar{I}$ can be set as 3.0.

Still referring to FIG. 2, a phase x is determined as having over-voltage, if the following condition is met:

$$|V_{p,x}|/V_{p,x}^{rated} \geq \bar{V} x \in \{a,b,c\} \tag{4}$$

wherein $|V_{p,x}|$ and $V_{p,x}^{rated}$ are the magnitudes of measured effective voltages, and rated voltage on phase x at intelligent switch p, and $\bar{V}$ is the pre-defined threshold of voltage ratio of measured voltage over rated voltage used for over voltage status determination. For example, $\bar{V}$ can be set as 1.40 per unit.

According to the locations of intelligent switches, each circuit downstream to the substation transformer is divided into a set of circuit or feeder section. Each circuit section is bounded by a set of intelligent switches. Taken FIG. 2 as example, the system includes three sections, section A, section B and section C. Section A includes three intelligent switches, section B includes two intelligent switches, and section C includes one intelligent switch.

Dominant Vibration Mode Extraction for Measured Fault Waveforms

Figure 3A:
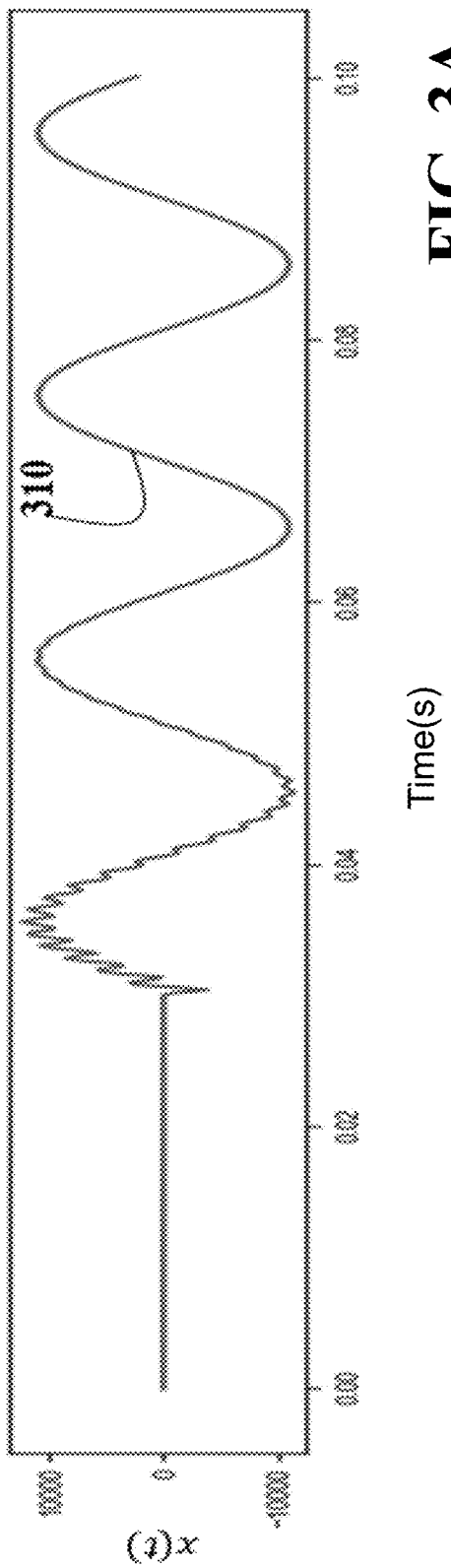
FIG. 3A is a schematic illustrating for a measured transient signal, according to some embodiments of the present disclosure.
Figure 3B:
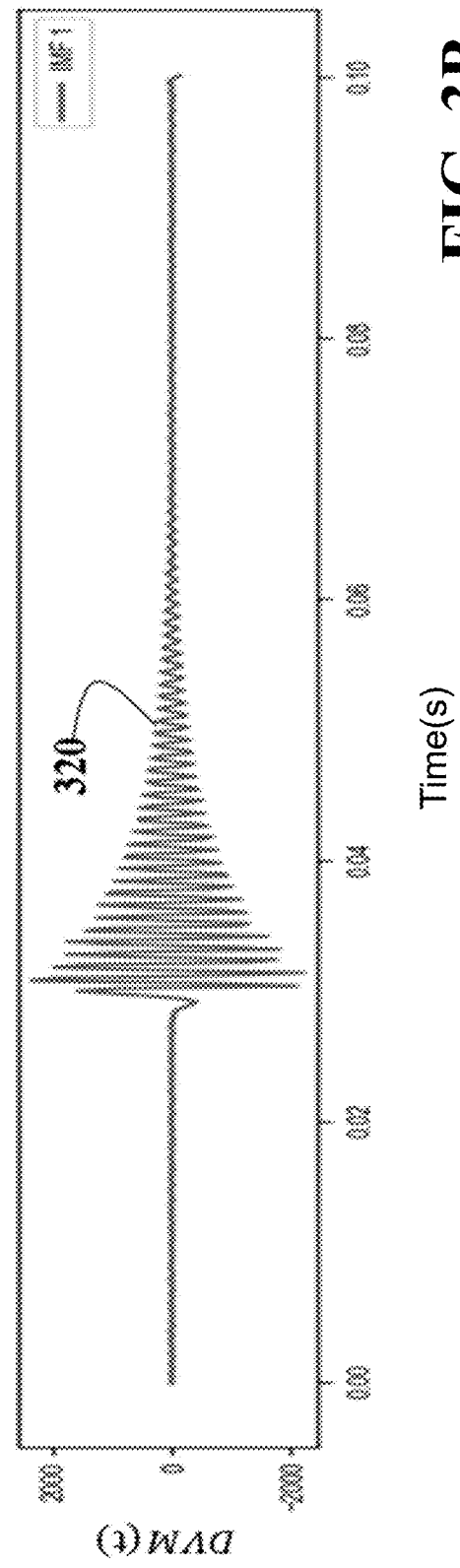
FIG. 3B is a schematic illustrating for a domain vibration mode of the measured transient signal, according to some embodiments of the present disclosure.

FIG. 3A and FIG. 3B are schematics illustrating for a measured transient signal 310 and its domain vibration mode 320, according to some embodiments of the present disclosure;

The dominant vibration mode can be extracted from measured fault waveforms using the empirical mode decomposition (EMD) method. The EMD decomposes the signal into a set of intrinsic mode functions (IMFs). Each IMF is a wave that the mean of the wave is zero, and the difference number of maxima and minima at most by 1. Maxima is the value of the signal where when the trend in the signal continues to go up then suddenly go down, the value right before the value goes down is maxima. On the other hand, Minima is when the trend in the signal continues to go down then suddenly go up, the value right before goes up is minimal. The first IMF is the dominant vibration mode (DVM) we are seeking for.

Still referring to FIG. 3A and FIG. 3B, let x[n] be the measured discrete fault signal of interest. For example, x[n] can be the gamma component of phase voltages if locating the phase to ground faults, and alpha and beta components of phase currents if locating other types of faults. The algorithm for determining the dominant vibration mode DVM[n] can be described as follows:

Step-1, set iteration number k=0, and signal residuum $r_0[n]=x[n]$.

Step-2, find the minima and maxima of signal of $r_k[n]$.

Step-3, interpolate the value of minima and maxima to create an envelope of minima and maxima using a cubic spline, $e_{kmin}[n]$ and $e_{kmax}[n]$.

Step-4, from the envelope of minima and maxima, get the middle value:

$$m_k[n]=(e_{kmin}[n]+e_{kmax}[n])/2 \tag{5}$$

Step-5, get DVM candidate, $h_k[n]$ by decreasing the value of the signal $r_k[n]$ by the middle value of the envelope, $m_k[n]$:

$$h_k[n]=r_k[n]-m_k[n] \tag{6}$$

Step-6, Check if this extracted signal $h_k$ is an IMF. If not satisfied, set k=k+1, $r_{k+1}[n]=h_k[n]$, and repeat step 2 to step 4.

To overcome mode mixing problem pertaining to the Empirical Mode Decomposition (EMD) method, i.e., the presence of oscillations of very disparate amplitude in a mode, or the presence of very similar oscillations in different modes, the ensemble empirical mode decomposition (EEMD) can be used to performs the EMD over an ensemble of the signal plus Gaussian white noise.

Still referring to FIG. 3A and FIG. 3B, the EEMD algorithm for determining the dominant vibration mode DVM[n] can be described as follows:

generate $x^i[n]=x[n]+w^i[n]$, where $w^i[n]$ (i=1, ..., I) are different realizations of white Gaussian noise.

Obtain $DVM^i[n]$ using EMD for each $x^i[n]$.

Determine DVM[n] as the average of the corresponding $DVM^i[n]$:

$$DVM[n] = \frac{1}{I}\sum_{i=1}^{I}DVM^i[n] \tag{7}$$

Computing Instantaneous and Integral Feature Attributes at Characteristic Timings After obtained the dominant vibration mode, we can get a set of instantaneous feature attributes to characterize the dominant vibration mode by using the Hilbert-Huang transform (HHT).

Still referring to FIG. 3A and FIG. 3B, for the dominant vibration mode DVM(t) of a fault signal x(t), Hilbert-Huang transform is applied to extract the instantaneous amplitude, phase, and frequency of the analyzed signal. The Hilbert-Huang transform for DVM(t) is represented as:

$$H[DVM(t)] = \frac{1}{\pi}PV\int_{-\infty}^{\infty}\frac{DVM(\varsigma)}{t-\varsigma}d\varsigma \tag{8}$$

where PV indicates the Cauchy principal value. With those definition, both DVM(t) and H[DVM(t)] are complex conjugate pairs form an analytical signal, Z(t), $$Z(t)=DVM(t)+jH[DVM(t)]=A(t)e^{j\theta(t)} \tag{9}$$

A(t) and θ(t) are the instantaneous amplitude and phase information that can be represented as:

$$A(t) = \sqrt{DVM(t)^2 + H[DVM(t)]^2} \quad (10)$$

$$\theta(t) = \arctan\frac{H[DVM(t)]}{DVM(t)} \quad (11)$$

and the instantaneous frequency of DVM(t) is given as:

$$f(t) = \frac{1}{2\pi}\frac{d\theta(t)}{dt} \quad (12)$$

Figure 4A:
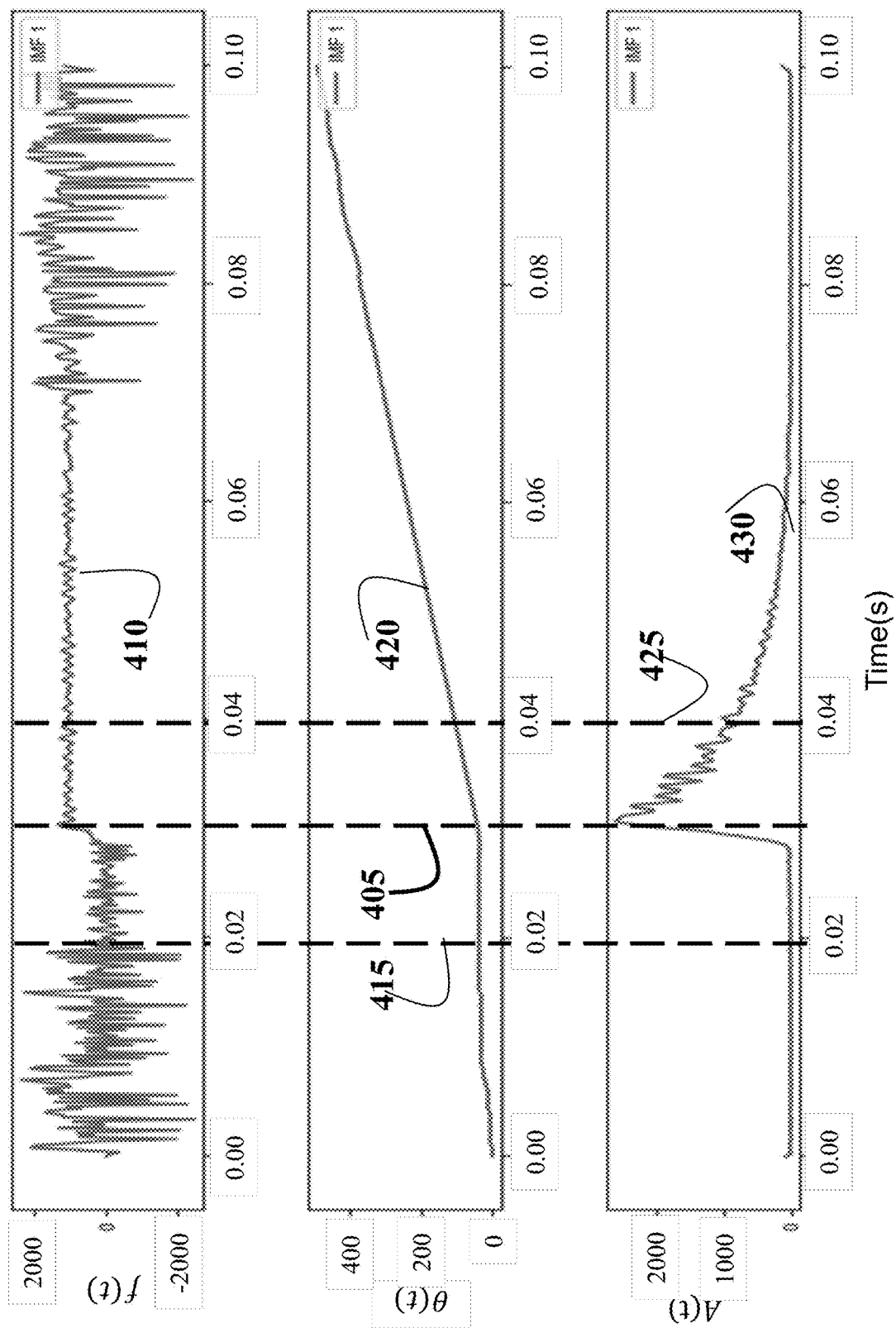
FIG. 4A is a schematic illustrating for instantaneous feature attributes of dominant vibration mode, according to some embodiments of the present disclosure.

FIG. 4A is a schematic illustrating for instantaneous feature attributes of dominant vibration mode, including instantaneous frequency 410, instantaneous phase 420, and instantaneous amplitude 430, according to some embodiments of the present disclosure;

We also define three integral attributes to express the accumulated features for the signal DVM(t), including the integral of amplitude IA(t), the integral of amplitude square $IA^2$(t), and the integral of amplitude-frequency product square $IA^2f^2$(t).

Figure 4B:
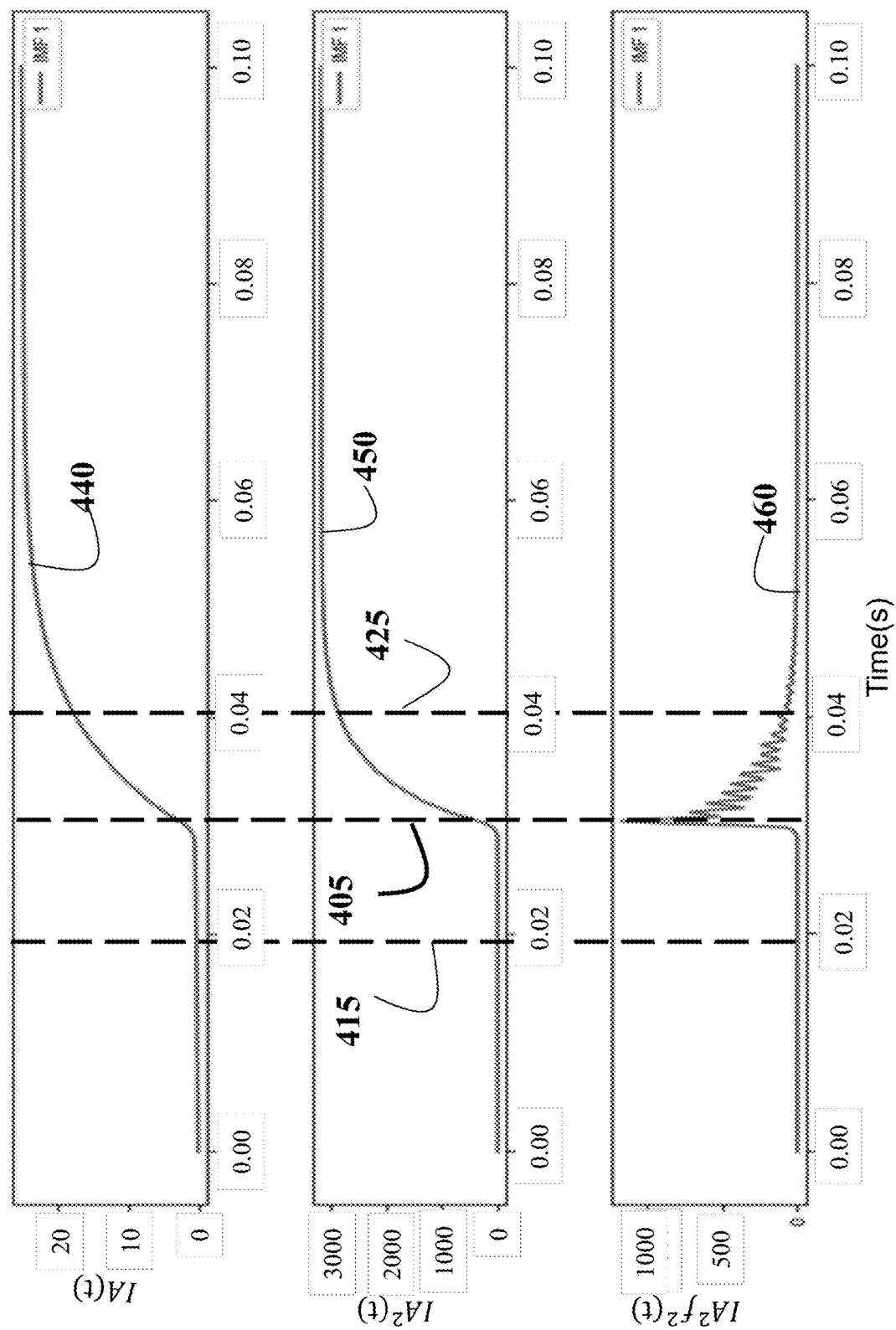
FIG. 4B is a schematic illustrating for integral feature attributes of dominant vibration mode, according to some embodiments of the present disclosure.

FIG. 4B is a schematic illustrating for integral feature attributes of dominant vibration mode, including the integral of amplitude 440, the integral of amplitude square 450 and the integral of amplitude-frequency product square 460, according to some embodiments of the present disclosure.

Referring to FIG. 4B, the integral of amplitude of DVM(t) is defined as:

$$IA(t)=\int_0^t A(t)dt \quad (13)$$

The integral of amplitude square of DVM(t) is defined as:

$$IA^2(t)=\int_0^t A^2(t)dt \quad (14)$$

The integral of amplitude-frequency product square of DVM(t) is defined as:

$$IA^2f^2(t)=\int_0^t A^2(t)f^2(t)dt \quad (15)$$

We use the instantaneous feature attributes to represent the impacts of fault inception time and fault severity, and the integral feature attributes to assist modeling pre-fault and post-fault conditions.

Instead of using entire waveforms of instantaneous and integral feature attributes, we can characterize the fault event at a set of characteristic timing moments, including the fault inception time 405, the pre-fault time at specific moment 415, and the post-fault time at specific moment 425. Considered the required data volumes and significance to the fault evolving, we only retrieve the pre-fault attributes at half cycle of power frequency before the fault inception time, and the post-fault attributes at half cycle of power frequency after the fault inception time.

Still referring to FIG. 4B, the fault inception time 405 can be determined based on the moments of instantaneous amplitudes 430 and instantaneous phase 420 turning-up points of the measured fault voltage or current signal or the corresponding derived signals. Taken a single phase to ground fault as example, when it occurs in the ungrounded distribution system, the gamma component of voltages generated by the fault event undergoes a significant change in amplitude and frequency, and then create a saltation in the instantaneous amplitude and sudden turning up for instantaneous phases. Therefore, the moment for the highest amplitude can be regarded as the fault inception time, if there is a turning point for significant phase change at the proximity of the moment. Or the moment for a turning point for significant phase change can be regarded as the fault inception time, if there is a highest amplitude observed at the proximity of the moment.

Figure 5A:
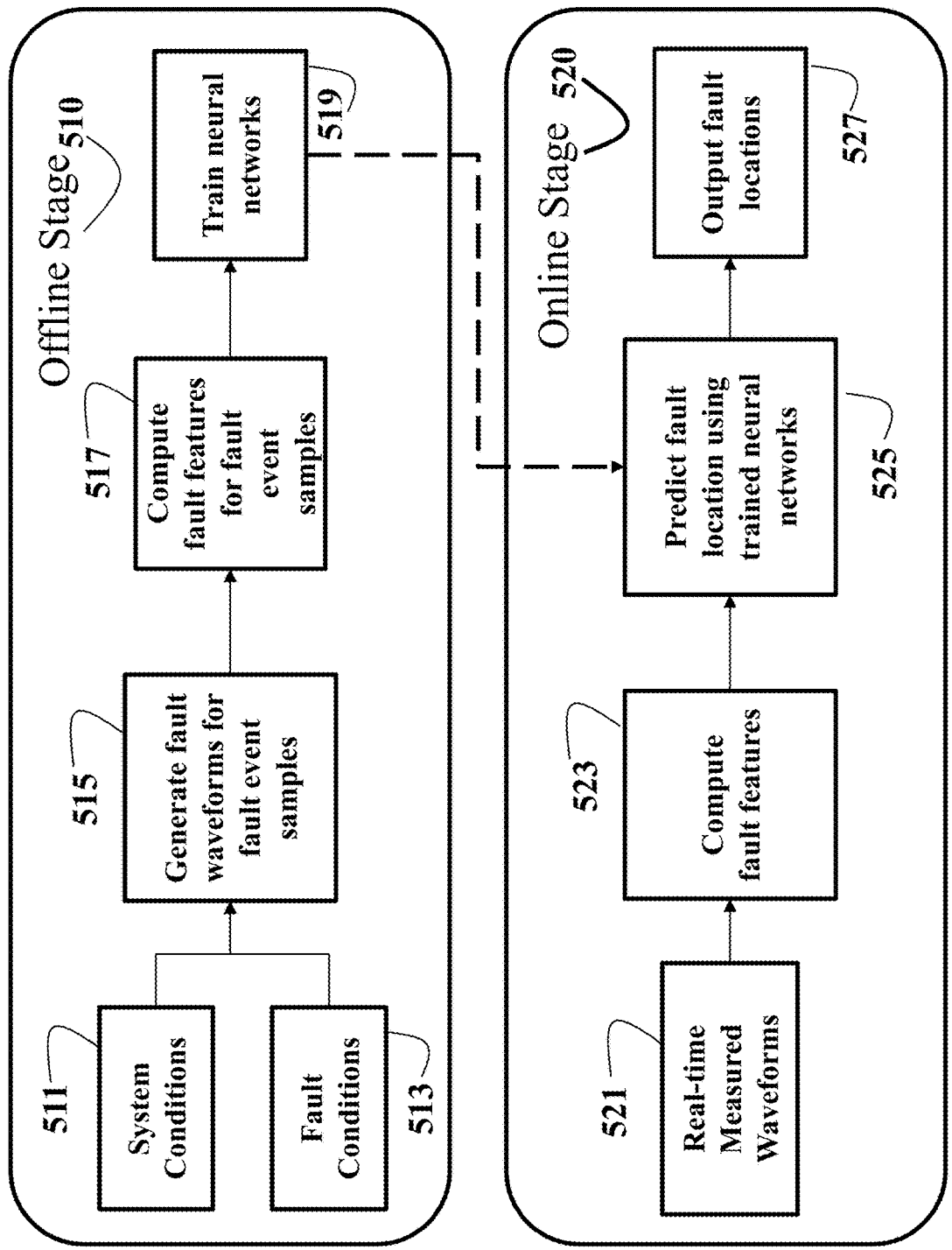
FIG. 5A is a schematic illustrating using a supervised learning method to predict fault locations, according to some embodiments of the present disclosure.

Building Model for Fault Location Relevant to Dominant Feature Attributes Through Supervising Learning FIG. 5A is a schematic illustrating using a supervised learning method to predict fault locations, according to some embodiments of the present disclosure. Aspects of the present disclosure uses supervising learning method to model fault location with dominant features and predict fault location using the learned model. An embodiment of an overall scheme of the method is illustrated in FIG. 5A, which includes two parts: offline stage 510 and online stage 520, where the former is for data-generation 517 and training of the neural networks 519, and the latter uses the online measurements 521 and the trained neural networks for real-time fault location prediction 525.

The offline data generation is to prepare training sample data sets 515 for fault events and associated simulated effective and instantaneous voltage and current measurements at intelligent switches. Each sampled fault event may represent a different combination of fault condition 513 and pre-fault system condition 511. The fault condition 513 includes fault inception time, fault spot, fault type and fault impedance. The pre-fault system condition 511 may include load demands at each bus or line segment, the target generation outputs and regulated voltage levels for the substation and controllable distributed generators, and the generation outputs for the uncontrollable distributed generations. The time-domain simulation is used to simulate the fault evolving process for each sample event, and record the effective and instantaneous readings for each intelligent switch during the course of the fault.

Still referring to FIG. 5A, when the training samples are ready, a set of neural networks can be used and trained to model the relationship between fault locations and fault transient features. Each neural network may correspond to a specific fault type or a set of fault types set, a specific coverage section or a set of sections, and a specific set of intelligent switches. Taken the system in FIG. 2 as example, for each individual section, we can use two neural networks to model all types of faults within the section, one for single-phase-to-ground faults, and one for other multiple-phase faults.

Figure 5B:
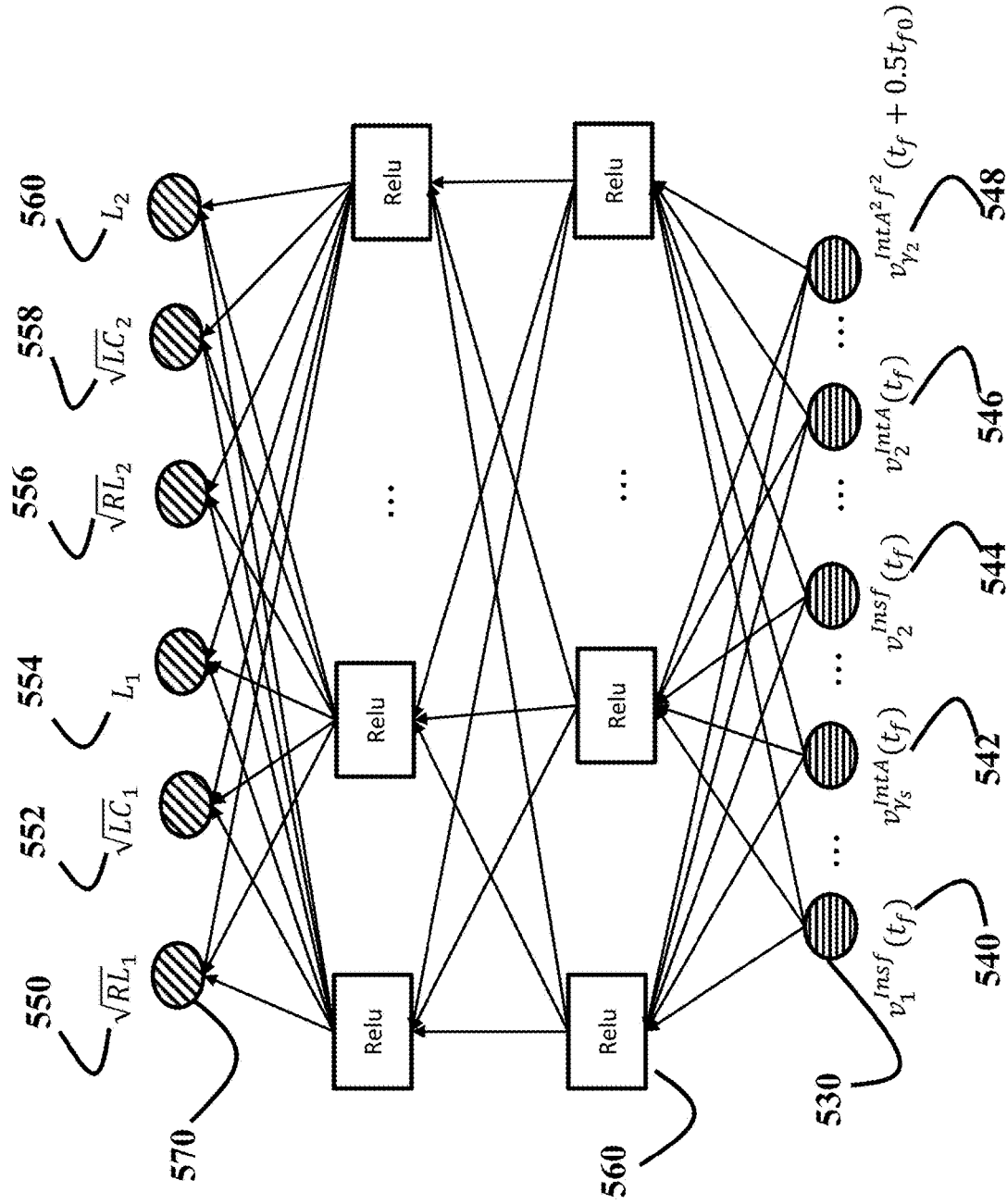
FIG. 5B is a schematic illustrating a multiple-layer neural network model used by the supervised learning method for relating fault location parameters with instantaneous and integral feature attributes of dominant vibration mode of measured waveforms, according to some embodiments of the present disclosure.

FIG. 5B is a schematic illustrating a multiple-layer feed-forward neural network model used by the supervised learning method for relating fault location parameters with instantaneous and integral feature attributes of dominant vibration mode of measured waveforms, according to some embodiments of the present disclosure. For example, FIG. 5B is an exemplar neural network used to model the fault location function of single phase to ground faults occurring in Section B of FIG. 2.

Each neural network is a multiple layered forward neural network as illustrated in FIG. 5B, which consists of one input layer 530, L hidden layers 560, and one output layer 570. The input layer 530 passes the normalized transient features to the first hidden layer as inputs. The hidden layer l 560 takes an input vector $x_t^{[l]}$, and computes a (hidden) output vector $h_t^{[l]}$ according to:

$$h_t^{[l]}=\mathrm{relu}(W^{[l]}x_t^{[l]}+b^{[l]}) \quad (16)$$

where relu(x)=max(0, x) denotes a rectified linear unit function that is applied element-wise, $W^{[l]}$ is a weight matrix, and $b^{[l]}$ is a bias vector. Note that the output vector of one hidden layer is the input vector for the next hidden layer, i.e., $x^{[l+1]}=h^{[l]}$, except the last hidden layer, the output of which is mapped to the output through a sigmoid layer, i.e. the output layer 570 as follows:

$$y_t = \sigma(Wh^{[L]} + b) \quad (17)$$

where W is a weight matrix, and b is a bias vector, σ denotes the sigmoid function, $$\sigma(x) = \frac{1}{1 + e^x}.$$

The values of $y_t$ are converted into actual fault location parameters based on the minimal and maximal values for each fault location parameter. The neural network is trained using back-propagation algorithm such that the mean squared error between the predicted output $y_t$ and the true value $d_t$ is minimized, i.e., by minimizing the following loss function, l':

$$l' = \frac{1}{m^{tr}} \sum_{k=1}^{m^{tr}} (y_t - d_t)^2 \quad (18)$$

where, $m^{tr}$ is the total number of samples for the neural network training.

Still referring to FIG. 5B, the number of output units in the output layer 570 is determined as three times of the total number of intelligent switches installed in the section. For each intelligent switch s, we use three locational parameters to describe the relative distances from the fault point f to the switch s, including an equivalent square root of resistance-inductance product $\sqrt{LC_{f\text{-}s}}$, an equivalent inductance $L_{f\text{-}s}$, and an equivalent square root of inductance-capacitance product $\sqrt{RL_{f\text{-}s}}$, which are defined as:

$$\sqrt{LC_{f-s}} = \sum_{ij \in S(f,s)} \sqrt{|L_{ij} C_{ij}|} \quad (19)$$

$$L_{f-s} = \sum_{ij \in S(f,s)} |L_{ij}| \quad (20)$$

$$\sqrt{RL_{f-s}} = \sum_{ij \in S(f,s)} \sqrt{|R_{ij} L_{ij}|} \quad (21)$$

where $S(f,s)$ is the set of line segments within the shortest paths from point f to intelligent switch s. $R_{ij}$, $L_{ij}$ and $C_{ij}$ are the distributed resistance, inductance and capacitance for line segment from point i to point j. Those three parameters are used to differentiate the different combinations of conductor type (overhead/cable), conductor series impedance and shunt admittance, and distance between fault point and the measured points. Referring to FIG. 5B, the neural network uses 6 output units to model the relative fault location measures to the intelligent switches installed in Section B, and 3 different locational parameters are used for each switch.

The number of input units in the input layer 530 is determined based on the fault signals to be used, the number of intelligent switches installed in the section, and the number of significant-correlated instantaneous and integral features.

Still referring to FIG. 5B, for a neural network used for single-phase-to-ground fault locating, the gamma components of voltage signals $v_\gamma(t)$ are used, and for each intelligent switch s at the section, assumed $t_f$ and $t_{f0}$ are the fault inception time and one power frequency duration, each intelligent switch may have eighteen transient features that can be served as candidate input signals for the neural network. Those candidates include the instantaneous frequency, phase and amplitude values for dominant vibration mode of $v_\gamma(t)$ measured at the switch s at the fault inception time $t_f$, pre-fault time ($t_f - 0.5t_{f0}$) and post-fault time ($t_f + 0.5t_{f0}$), i.e., $v_{\gamma_s}^{Insf}(t_f)$, $v_{\gamma_s}^{Insf}(t_f - 0.5t_{f0})$, $v_{\gamma_s}^{Insf}(t_f + 0.5t_{f0})$, $v_{\gamma_s}^{Ins\theta}(t_f)$, $v_{\gamma_s}^{Ins\theta}(t_f - 0.5t_{f0})$, $v_{\gamma_s}^{Ins\theta}(t_f + 0.5t_{f0})$, $v_{\gamma_s}^{InsA}(t_f)$, $v_{\gamma_s}^{InsA}(t_f - 0.5t_{f0})$, and $v_{\gamma_s}^{InsA}(t_f + 0.5t_{f0})$. Those candidates also include the integrals of amplitude, amplitude square, and amplitude-frequency product square of dominant vibration mode of $v_\gamma(t)$, i.e., $v_{\gamma_s}^{IntA}(t_f)$, $v_{\gamma_s}^{IntA}(t_f - 0.5t_{f0})$, $v_{\gamma_s}^{IntA}(t_f + 0.5t_{f0})$, $v_{\gamma_s}^{IntA^2}(t_f)$, $v_{\gamma_s}^{IntA^2}(t_f - 0.5t_{f0})$, $v_{\gamma_s}^{IntA^2}(t_f + 0.5t_{f0})$, $v_{\gamma_s}^{IntA^2f}(t_f)$, $v_{\gamma_s}^{IntA^2f}(t_f - 0.5t_{f0})$, and $v_{\gamma_s}^{IntA^2f}(t_f + 0.5t_{f0})$.

The example given in FIG. 5B, there are two switches in the section, therefore the inputs of the neural networks includes the instantaneous features 540 and integral features 542 determined for the first switch, and the instantaneous features 544 and integral features 546 and 548 determined for the second switch.

For a neural network used for multiple-phase fault locating, the alpha and beta components of current signals $i_\alpha(t)$, $i_\beta(t)$ are used, and for each intelligent switch s at the section, each intelligent switch may have thirty-six transient features that can be served as candidate input signals for the neural network. Those candidates include the instantaneous frequency, phase and amplitude values for dominant vibration mode of $i_\alpha(t)$, $i_\beta(t)$ measured at the switch s at the fault inception time $t_f$, pre-fault time ($t_f - 0.5t_{f0}$) and post-fault time ($t_f + 0.5t_{f0}$), i.e., $i_{\alpha_s}^{Insf}(t_f)$, $i_{\alpha_s}^{Insf}(t_f - 0.5t_{f0})$, $i_{\alpha_s}^{Insf}(t_f + 0.5t_{f0})$, $i_{\alpha_s}^{InsA}(t_f)$, $i_{\alpha_s}^{InsA}(t_f - 0.5t_{f0})$, $i_{\alpha_s}^{InsA}(t_f + 0.5t_{f0})$, $i_{\alpha_s}^{Ins\theta}(t_f)$, $i_{\alpha_s}^{Ins\theta}(t_f - 0.5t_{f0})$, $i_{\alpha_s}^{Ins\theta}(t_f + 0.5t_{f0})$, $i_{\beta_s}^{Insf}(t_f)$, $i_{\beta_s}^{Insf}(t_f - 0.5t_{f0})$, $i_{\beta_s}^{Insf}(t_f + 0.5t_{f0})$, $i_{\beta_s}^{InsA}(t_f)$, $i_{\beta_s}^{InsA}(t_f - 0.5t_{f0})$, $i_{\beta_s}^{InsA}(t_f + 0.5t_{f0})$, $i_{\beta_s}^{Ins\theta}(t_f)$, $i_{\beta_s}^{Ins\theta}(t_f - 0.5t_{f0})$, and $i_{\beta_s}^{Ins\theta}(t_f + 0.5t_{f0})$.

Still referring to FIG. 5B, those candidates also include the integrals of amplitude, amplitude square, and amplitude-frequency product square of dominant vibration mode of $i_\alpha(t)$, $i_\beta(t)$, i.e., $i_{\alpha_s}^{IntA}(t_f)$, $i_{\alpha_s}^{IntA}(t_f - 0.5t_{f0})$, $i_{\alpha_s}^{IntA}(t_f + 0.5t_{f0})$, $i_{\alpha_s}^{IntA^2}(t_f)$, $i_{\alpha_s}^{IntA^2}(t_f - 0.5t_{f0})$, $i_{\alpha_s}^{IntA^2}(t_f + 0.5t_{f0})$, $i_{\alpha_s}^{IntA^2f}(t_f)$, $i_{\alpha_s}^{IntA^2f}(t_f - 0.5t_{f0})$, $i_{\alpha_s}^{IntA^2f}(t_f + 0.5t_{f0})$, $i_{\beta_s}^{IntA}(t_f)$, $i_{\beta_s}^{IntA}(t_f - 0.5t_{f0})$, $i_{\beta_s}^{IntA}(t_f + 0.5t_{f0})$, $i_{\beta_s}^{IntA^2}(t_f)$, $i_{\beta_s}^{IntA^2}(t_f - 0.5t_{f0})$, $i_{\beta_s}^{IntA^2}(t_f + 0.5t_{f0})$, $i_{\beta_s}^{IntA^2f}(t_f)$, $i_{\beta_s}^{IntA^2f}(t_f - 0.5t_{f0})$, and $i_{\beta_s}^{IntA^2f}(t_f + 0.5t_{f0})$.

The determined input candidates are further prioritized based on its maximal cross-correlation degree with determined output variables, and only a subset of all candidate inputs that have a maximal cross-correlation degree greater than a pre-determined threshold are determined as final input signals used for configuring the neural network for fault location determination. For an input candidate $Inp_i^{cand}$, its maximal cross-correlation degree is defined as:

$$Corre(Inp_i^{cand}) = \max_{Out_j \in S_{out}} corre(Inp_i^{cand}, Out_j) \quad (22)$$

where $S_{out}$ is the set of all output variables of the neural network, and $Out_j$ is its j-th output variable of the set. $corre(Inp_i^{cand}, Out_j)$ is the cross-correlation degree between the i-th input candidate and the j-th output, and defined as:

$$corre(Inp_i^{cand}, Out_j) = \quad (23)$$

$$\frac{\sum_{k=1}^{m^{tr}}\left[(Inp_{i,t}^{cand} - \overline{Inp_i^{cand}})(Out_{j,t} - \overline{Out_j})\right]}{\sqrt{\sum_{k=1}^{m^{tr}}\left[(Inp_{i,t}^{cand} - \overline{Inp_i^{cand}})^2\right]\sum_{k=1}^{m^{tr}}\left[(Out_{j,t} - \overline{Out_j})^2\right]}}$$

where $Inp_{i,t}^{cand}$ and $Out_{j,t}$ are the i-th input candidate and j-th output values for the t-th sample fault event, $\overline{Inp_i^{cand}}$ and $\overline{Out_j}$ are the average values of the i-th input candidate and j-th output variables for all sample fault events.

Still referring to FIG. 5B, after trained using sufficient number of training samples over well-scattered system and fault conditions, the neural network can be used to predict the fault locations for the pre-defined fault type.

Determining Fault Section, Fault Line Segment and Fault Point

When a fault is detected based on the effective voltage and current measurements on the intelligent switch directly downstream to the substation transformer, and corresponding fault type is identified. Each circuit or feeder section downstream to the substation transformer can trigger a fault locating task using a trained neural network according to the determined fault type.

Still referring to FIG. 5B, each circuit or feeder first extracts the dominant vibration modes for voltage or current fault signals corresponding to the determined fault types, and then calculates the instantaneous and integral features for the fault signals.

Using the determined set of features as inputs for the trained neural network for the determined fault type, a set of estimated fault locational parameters can be determined for each intelligent switch of the section, i.e., $$\sqrt{\overline{LC_{f-s}}}, \overline{L_{f-s}},$$

and $$\sqrt{\overline{RL_{f-s}}}, s \in S_{sw}, S_{sw}$$

is the set of intelligent switches in the section. Then for each line segment in the section, we check if each estimated locational parameter is within the bounds defined by corresponding locational parameters at two terminal buses of the line segment. If yes, the line segment under study, i.e. line between bus i and bus j is the fault line segment, and the section is the fault section.

For any line segment bus i and bus j, it is determined as a faulty one only when all conditions expressed as (24a), (24b) and (24c) for each intelligent switch s in the section are satisfied:

$$\sqrt{LC_{i-s}} \leq \sqrt{\overline{LC_{f-s}}} \leq \sqrt{LC_{j-s}} \text{ or } \sqrt{LC_{j-s}} \leq \sqrt{\overline{LC_{f-s}}} \leq \sqrt{LC_{j-s}}, \quad (24a)$$

$$s \in S_{sw}$$

$$L_{i-s} \leq \overline{L_{f-s}} \leq L_{j-s} \text{ or } L_{j-s} \leq \overline{L_{f-s}} \leq L_{i-s}, s \in S_{sw} \quad (24b)$$

$$\sqrt{RL_{i-s}} \leq \sqrt{\overline{RL_{f-s}}} \leq \sqrt{RL_{j-s}} \text{ or } \sqrt{RL_{j-s}} \leq \sqrt{\overline{RL_{f-s}}} \leq \sqrt{RL_{j-s}}, \quad (24c)$$

$$s \in S_{sw}$$

where $\sqrt{LC_{i-s}}$, $L_{i-s}$ and $\sqrt{RL_{i-s}}$ are the square root of inductance-capacitance product, the equivalent square root of resistance-inductance product and the equivalent inductance between bus i and intelligent switch s, $\sqrt{LC_{j-s}}$, $L_{j-s}$ and $\sqrt{RL_{j-s}}$ are the square root of inductance-capacitance product, the equivalent square root of resistance-inductance product and the equivalent inductance between bus j and intelligent switch s.

Still referring to FIG. 5B, if none of line segments satisfies the conditions (24), the fault is not in this section.

The exact fault spot along the determined fault line segment between bus i and bus j is determined by the ratio of distance between the spot to bus i over total length of the line segment between bus i and bus j, $\rho_{f-i}$ that defined as:

$$\rho_{f-i} = \frac{1}{3\|S_{sw}\|}\left(\frac{\sqrt{\overline{LC_{f-s}}} - \sqrt{LC_{i-s}}}{\sqrt{LC_{j-s}} - \sqrt{LC_{i-s}}} + \frac{\overline{L_{f-s}} - L_{i-s}}{L_{j-s} - L_{i-s}} + \frac{\sqrt{\overline{RL_{f-s}}} - \sqrt{RL_{i-s}}}{\sqrt{RL_{j-s}} - \sqrt{RL_{i-s}}}\right) \quad (25)$$

where $\|S_{sw}\|$ is the length of set $S_{sw}$.

Features

Some aspects of the present disclosure include that the trained neural network models include a trained neural network model for each fault type, wherein fault types include single-phase-to-ground faults, and multiple-phase faults such as phase-to-phase, double-phase-to-ground, three-phase-to-ground, and phase-to-phase-to-phase faults; wherein the fault type is determined based on voltage and current measurements with effective values.

A aspect of the present disclosure includes that each fault type trained neural network model is trained using a set of fault event samples; wherein each fault event sample includes a given fault condition and system condition, and corresponding measurements of voltage/current transient response waveforms at the intelligent switches installed in the UED system; wherein the fault condition includes fault type, fault location point, fault impedance at the fault location point, and fault inception time; wherein the system condition includes load demands, generation outputs, and voltage levels.

Another aspect of the present disclosure includes that the trained neural network model is limited to identify fault conditions for a circuit or feeder section bounded by a set of intelligent switches on the circuit or feeder.

A aspect of the present disclosure includes that the effective values include Root Mean Square (RMS) values sampled at a rate that is less than an instantaneous values sample rate, such that the effective values are measurements used to represent system steady-state behaviors, and employed to determine whether there is a fault condition in the UED system.

Another aspect includes that the effective values sample rate is at about once per second, and the instantaneous values sample rate is about 5000 times per second.

Yet another aspect that the instantaneous values measurements are used to capture system transient responses to fault events, and employed to determine actual fault section, actual fault line segment and actual fault point along the faulted line segment.

An aspect includes that the set of instantaneous and integral feature attributes at the pre-fault time period, at the fault inception time period and at the post-fault time period, include instantaneous amplitudes, instantaneous phase, instantaneous frequency, integral amplitudes, integral amplitude squares, and integral square of amplitude and frequency product at half cycle before the fault event, occurring time of the fault event, and half cycle after the fault event.

Another aspect includes that the fault inception time is be determined based on the timings of peaks of associated waveforms for instantaneous amplitudes and the timings of turning-up points of associated waveforms for instantaneous phases.

A aspect includes that three locational parameters are used to describe the relative distances from the fault point to an intelligent switch, including an equivalent square root of resistance-inductance product, an equivalent inductance, and an equivalent square root of inductance-capacitance product, which are determined based on distributed resistances, inductances and capacitances for all line segments on a shortest path from the fault point to the intelligent switch.

Another aspect includes that the fault section is determined by comparing the determined locational parameters of the fault event with the corresponding set of locational parameters determined for boundary intelligent switches of each circuit or feeder section in the UED system; wherein the fault line segment and the fault location point is determined by comparing the determined locational parameters of the fault event with the corresponding set of locational parameters determined for terminal buses of each line segments in the determined fault section.

Another aspect includes that an empirical mode decomposition is applied to the voltage and current response waveform measurements plus Gaussian white noises to extract a dominant vibration mode and an associated derived waveform corresponding to the dominant vibration mode.

Yet another aspect includes that the intelligent switches are in communication with each other, and are configured to issue control commands.

Figure 6:
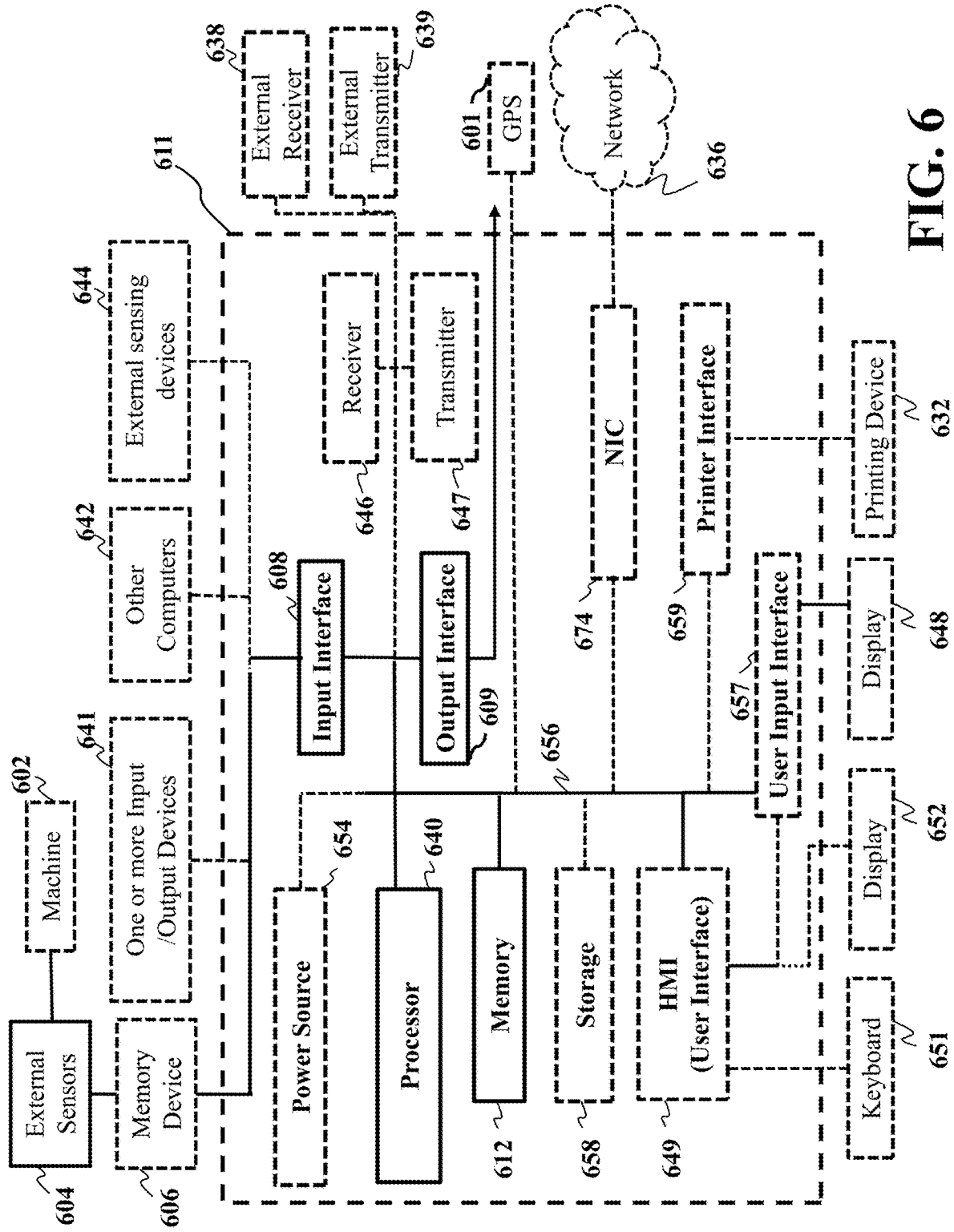
FIG. 6 is a block diagram of illustrating the method of FIG. 1A, that can be implemented using an alternate fault location analysis system that controlled by distribution system operators, according to embodiments of the present disclosure.

FIG. 6 is a block diagram of illustrating the method of FIG. 1A, that can be implemented using an alternate fault location analysis system that controlled by distribution system operators, according to embodiments of the present disclosure. The system 611 includes a processor 640, computer readable memory 612, storage 658 and user interface 649 with display 652 and keyboard 651, which are connected through bus 656. For example, the user interface 649 in communication with the processor 640 and the computer readable memory 612, acquires and stores the data in the computer readable memory 612 upon receiving an input from a surface, keyboard surface, of the user interface 657 by a user.

Contemplated is that the memory 612 can store instructions that are executable by the processor, historical data, and any data to that can be utilized by the methods and systems of the present disclosure. The processor 640 can be a single core processor, a multi-core processor, a computing cluster, or any number of other configurations. The processor 640 can be connected through a bus 656 to one or more input and output devices. The memory 612 can include random access memory (RAM), read only memory (ROM), flash memory, or any other suitable memory systems.

Still referring to FIG. 6, a storage device 658 can be adapted to store supplementary data and/or software modules used by the processor. For example, the storage device 658 can store historical data and other related data as mentioned above regarding the present disclosure. Additionally, or alternatively, the storage device 658 can store historical data similar to data as mentioned above regarding the present disclosure. The storage device 658 can include a hard drive, an optical drive, a thumb-drive, an array of drives, or any combinations thereof.

The system can be linked through the bus 656 optionally to a display interface (not shown) adapted to connect the system to a display device (not shown), wherein the display device can include a computer monitor, camera, television, projector, or mobile device, among others.

The system 611 can include a power source 654, depending upon the application the power source 654 may be optionally located outside of the system 611. Linked through bus 656 can be a user input interface 657 adapted to connect to a display device 648, wherein the display device 648 can include a computer monitor, camera, television, projector, or mobile device, among others. A printer interface 659 can also be connected through bus 656 and adapted to connect to a printing device 632, wherein the printing device 632 can include a liquid inkjet printer, solid ink printer, large-scale commercial printer, thermal printer, UV printer, or dye-sublimation printer, among others. A network interface controller (NIC) 674 is adapted to connect through the bus 656 to a network 636, wherein data or other data, among other things, can be rendered on a third-party display device, third party imaging device, and/or third-party printing device outside of the system 611. Further, the bus 656 can be connected to a Global Positioning System (GPS) device 601 or a similar related type device.

Still referring to FIG. 6, the data or other data, among other things, can be transmitted over a communication channel of the network 636, and/or stored within the storage system 658 for storage and/or further processing. Further, the data or other data may be received wirelessly or hard wired from a receiver 646 (or external receiver 638) or transmitted via a transmitter 647 (or external transmitter 639) wirelessly or hard wired, the receiver 646 and transmitter 647 are both connected through the bus 656. The system 611 may be connected via an input interface 908 to external sensing devices 644 and external input/output devices 641. The system 611 may be connected to other external computers 642, memory device 606, external sensors 604 and machine 602. An output interface 609 may be used to output the processed data from the processor 640.

Embodiments

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Further, embodiments of the present disclosure and the functional operations described in this specification can be implemented in digital electronic circuitry, in tangibly-embodied computer software or firmware, in computer hardware, including the structures disclosed in this specification and their structural equivalents, or in combinations of one or more of them. Further some embodiments of the present disclosure can be implemented as one or more computer programs, i.e., one or more modules of computer program instructions encoded on a tangible non-transitory program carrier for execution by, or to control the operation of, data processing apparatus. Further still, program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

According to embodiments of the present disclosure the term "data processing apparatus" can encompass all kinds of apparatus, devices, and machines for processing data, including by way of example a programmable processor, a computer, or multiple processors or computers.

A computer program (which may also be referred to or described as a program, software, a software application, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network. Computers suitable for the execution of a computer program include, by way of example, can be based on general or special purpose microprocessors or both, or any other kind of central processing unit. Generally, a central processing unit will receive instructions and data from a read only memory or a random-access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

What is claimed is:

1. A system for identifying a fault condition in an Ungrounded Electrical Distribution (UED) system, the system comprising:

a memory configured to store data including trained neural network models, wherein the trained neural network models include a trained neural network model for each fault type, wherein each fault type is one of a single-phase-to-ground fault, a phase-to-phase fault, a double-phase-to-ground fault, a three-phase-to-ground fault, or a phase-to-phase-to-phase fault, wherein a fault type is determined based on voltage and current measurements with effective values;

a transceiver configured to receive measurements with instantaneous values and effective values associated with a fault event, from intelligent switches installed in the UED system, via an information network in communication with the UED system, such that the intelligent switches determine measured voltage and current transient response waveforms and a fault type; and a processor of a computer in communication with the information network, the processor configured to:

apply an empirical mode decomposition to the measured voltage and current transient response waveforms to extract a dominant vibration mode and an associated derived waveform corresponding to the dominant vibration mode, and apply a Hilbert transform to the associated derived waveform to obtain a set of instantaneous and integral feature attributes;

compute corresponding time relationships of subsets from the set of instantaneous and integral feature attributes, at a pre-fault time period to obtain a subset of pre-fault feature attributes, at a fault inception time period to obtain a subset of fault inception feature attributes, and at a post-fault time period to obtain a subset of fault inception feature attributes;

generate locational parameters using the stored trained neural network model associated with the identified fault type by inputting the subsets of the instantaneous and integral feature attributes into the stored trained neural network model, such that some locational parameters describe a relationship between one or more intelligent switch locations and an estimated fault location;

determine a fault section, a fault line segment and a fault location point using the locational parameters with a topology connectivity analysis of the UED system; and deliver, via the transceiver, the determined fault location point associated with the fault condition in the UED system to one or more operators.

2. The system according to claim 1, wherein each fault type trained neural network model is trained using a set of fault event samples, wherein each fault event sample includes a given fault condition and a given system condition, and corresponding measurements of voltage/current transient response waveforms at the intelligent switches installed in the UED system, wherein the fault condition includes a fault type, a fault location point, a fault impedance at the fault location point, and a fault inception time, wherein the system condition includes load demands, generation outputs, and voltage levels.

3. The system according to claim 2, wherein the trained neural network model is limited to identify fault conditions for a circuit or feeder section bounded by a set of intelligent switches on the circuit or feeder.

4. The system according to claim 1, wherein the effective values include Root Mean Square (RMS) values sampled at a rate that is less than an instantaneous values sample rate, such that the effective values are measurements used to represent system steady-state behaviors, and employed to determine whether there is a fault condition in the UED system.

5. The system according to claim 1, wherein the instantaneous values measurements are used to capture system transient responses to fault events, and employed to determine actual fault section, actual line segment and actual fault point along the faulted line segment.

6. The system according to claim 1, wherein the set of instantaneous and integral feature attributes at the pre-fault time period, the fault inception time period and at the post-fault time period, include instantaneous amplitudes, instantaneous phase, instantaneous frequency, integral amplitudes, integral amplitude squares, and integral square of amplitude and frequency product at half cycle before the fault event, occurring time of the fault event, and half cycle after the fault event.

7. The system according to claim 6, wherein the fault inception time is determined based on the timings of peaks of associated waveforms for instantaneous amplitudes and the timings of turning-up points of associated waveforms for instantaneous phases.

8. The system according to claim 1, wherein three locational parameters are used to describe the relative distances from the fault point to an intelligent switch of the intelligent switches, including an equivalent square root of resistance-inductance product, an equivalent inductance, and an equivalent square root of inductance-capacitance product, which are determined based on distributed resistances, inductances and capacitances for all line segments on a shortest path from the fault point to the intelligent switch.

9. The system according to claim 1, wherein the processor is configured to determine the fault section by comparing the determined locational parameters of the fault event with a corresponding set of locational parameters determined for boundary intelligent switches of each circuit or feeder section in the UED system, and wherein the processor is configured to determine the fault line segment and the fault location point by comparing the determined locational parameters of the fault event with the corresponding set of locational parameters determined for terminal buses of each line segments in the determined fault section.

10. The system according to claim 1, an empirical mode decomposition is applied to the voltage and current response waveform measurements plus Gaussian white noises to extract a dominant vibration mode and an associated derived waveform corresponding to the dominant vibration mode.

11. A method for identifying a fault condition in an Ungrounded Electrical Distribution (UED) system, the method comprising:

accessing a memory with stored data including trained neural network models, wherein the trained neural network models include a trained neural network model for each fault type, wherein each fault type is one of a single-phase-to-ground fault, a phase-to-phase fault, a double-phase-to-ground fault, a three-phase-to-ground fault, or a phase-to-phase-to-phase fault, wherein a fault type is determined based on voltage and current measurements with effective values;

retrieving measurements with instantaneous values and effective values associated with a fault event, from intelligent switches installed in the UED system, via a network in communication with the UED system, such that the intelligent switches determine measured voltage/current transient response waveforms and a fault type;

applying an empirical mode decomposition to the voltage and current response waveform measurements to extract a dominant vibration mode and an associated derived waveform corresponding to the dominant vibration mode;

applying a Hilbert transform to the associated derived waveform to obtain a set of instantaneous and integral feature attributes;

computing corresponding time relationships of subsets from the set of instantaneous and integral feature attributes, at a pre-fault time period to obtain a subset of pre-fault feature attributes, at a fault inception time period to obtain a subset of fault inception feature attributes, and at a post-fault time period to obtain a subset of fault inception feature attributes;

inputting the subsets of the instantaneous and integral feature attributes into the stored trained neural network model associated with the identified fault type, such that the trained neural network model outputs locational parameters, such that some locational parameters describe a relationship between one or more intelligent switch locations and an estimated fault location;

determining a fault section, a fault line segment and a fault location point using the locational parameters with a topology connectivity analysis of the UED system; and delivering the determined fault location point associated with the fault condition in UED system to operators.

12. The method according to claim 11, wherein each fault type trained neural network model is trained using a set of fault event samples, wherein each fault event sample includes a given fault condition and a given system condition, and corresponding measurements of voltage/current transient response waveforms at the intelligent switches installed in the UED system, wherein the fault condition includes a fault type, a fault location point, a fault impedance at the fault location point, and a fault inception time, wherein the system condition includes load demands, generation outputs, and voltage levels.

13. The method according to claim 11, wherein the set of instantaneous and integral feature attributes at the pre-fault time period, the fault inception time period and at the post-fault time period, include instantaneous amplitudes, instantaneous phase, instantaneous frequency, integral amplitudes, integral amplitude squares, and integral square of amplitude and frequency product at half cycle before the fault event, occurring time of the fault event, and half cycle after the fault event.

14. The method according to claim 11, wherein three locational parameters are used to describe the relative distances from the fault point to an intelligent switch of the intelligent switches, including an equivalent square root of resistance-inductance product, an equivalent inductance, and an equivalent square root of inductance-capacitance product, which are determined based on distributed resistances, inductances and capacitances for all line segments on a shortest path from the fault point to the intelligent switch.

15. The method according to claim 11, wherein the fault inception time is determined based on the timings of peaks of associated waveforms for instantaneous amplitudes and the timings of turning-up points of associated waveforms for instantaneous phases.

16. The method according to claim 11, wherein determining the fault section comprises comparing the determined locational parameters of the fault event with a corresponding set of locational parameters determined for boundary intelligent switches of each circuit or feeder section in the UED system, and wherein determining the fault line segment and the fault location point comprises comparing the determined locational parameters of the fault event with the corresponding set of locational parameters determined for terminal buses of each line segments in the determined fault section.

17. The method according to claim 11, wherein the intelligent switches are in communication with each other, and are configured to issue control commands.

18. A non-transitory computer readable storage medium embodied thereon a program executable by a computer for performing a method for identifying a fault condition in an Ungrounded Electrical Distribution (UED) system, the method comprising:

accessing a memory with stored data including trained neural network models, wherein the trained neural network models include a trained neural network model for each fault type, wherein each fault type is one of a single-phase-to-ground fault, a phase-to-phase fault, a double-phase-to-ground fault, a three-phase-to-ground fault, or a phase-to-phase-to-phase fault, wherein a fault type is determined based on voltage and current measurements with effective values;

retrieving measurements with instantaneous values and effective values associated with a fault event, from intelligent switches installed in the UED system, via a network in communication with the UED system, such that the intelligent switches determine measured voltage/current transient response waveforms and a fault type;

applying an empirical mode decomposition to the voltage and current response waveform measurements to extract a dominant vibration mode and an associated derived waveform corresponding to the dominant vibration mode;

applying a Hilbert transform to the associated derived waveform to obtain a set of instantaneous and integral feature attributes;

computing corresponding time relationships of subsets from the set of instantaneous and integral feature attributes, at a pre-fault time period to obtain a subset of pre-fault feature attributes, at a fault inception time period to obtain a subset of fault inception feature attributes, and at a post-fault time period to obtain a subset of fault inception feature attributes;

inputting the subsets of the instantaneous and integral feature attributes into the stored trained neural network model associated with the identified fault type, such that the trained neural network model outputs locational parameters, such that some locational parameters describe a relationship between one or more intelligent switch locations and an estimated fault location;

determining a fault section, a fault line segment and a fault location point using the locational parameters with a topology connectivity analysis of the UED system; and delivering the determined fault location point associated with the fault condition in UED system to operators.

* * * * *